(12) United States Patent
Ohta et al.

(10) Patent No.: US 6,708,323 B2
(45) Date of Patent: Mar. 16, 2004

(54) METHOD AND APPARATUS FOR VERIFYING MASK PATTERN DATA ACCORDING TO GIVEN RULES

(75) Inventors: Kazutoshi Ohta, Kawasaki (JP); Tsutomu Horie, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 81 days.

(21) Appl. No.: 09/778,075

(22) Filed: Feb. 7, 2001

(65) Prior Publication Data

US 2002/0019968 A1 Feb. 14, 2002

(30) Foreign Application Priority Data

Aug. 9, 2000 (JP) ........................................ 2000-240583

(51) Int. Cl.[7] ............................................. G06F 17/50
(52) U.S. Cl. .................. 716/19; 716/4; 716/5; 716/18; 716/21
(58) Field of Search .................. 716/1–21; 250/492.2; 430/5; 707/8, 10; 714/760

(56) References Cited

U.S. PATENT DOCUMENTS 5,225,993 A * 7/1993 Iwatsuki et al. ............... 716/5
6,063,132 A * 5/2000 DeCamp et al. ............... 716/5
6,077,310 A * 6/2000 Yamamoto et al. .......... 716/19
6,078,737 A * 6/2000 Suzuki ........................ 716/19
6,425,112 B1 * 7/2002 Bula et al. .................... 716/5

FOREIGN PATENT DOCUMENTS

JP        6-259503         9/1994
JP      07319933 A    * 12/1995    ........... G06F/17/50

* cited by examiner

*Primary Examiner*—Vuthe Siek
*Assistant Examiner*—Helen Rossoshek
(74) *Attorney, Agent, or Firm*—Staas & Halsey LLP

(57) ABSTRACT

Pattern data of a designed circuit, including a plurality of feature data is verified according to given rules (S2). If feature data not meeting the rules exists, contents of the feature data are outputted as an error (S3), and if a designer considers the error is not problematic (false error) in view of characteristics of the circuit (S5), he inputs the error information indicating the error is false to add it to a file including the pattern data (S8). The file is read to perform processing on feature data to obtain exposure data for manufacturing a mask, and the feature data processed is verified according to given rules. If any feature data not meeting the rule exists, it is judged whether the contents of the feature data are included in the error information. If it is judged to be included, further judged whether the error is false. If false, the process is continued to repeat for the rest data.

10 Claims, 12 Drawing Sheets

FIG.3

```
STREAM,LIBNAME.DB,3,0,98/08/31,09:56:34,98/09/03,16:49:02;
FONTS,CALMA.TF,CALMA.TF,CALMA.TF,CALMA.TF;
ERR,120410,-15001,-45000,15000,45000,OK;
```
↑ HEADER

```
STRUCT,CELLNAME1,0.0010,98/07/06,16:18:49,98/09/01,10:56:28;
RECT,50,0,-15001,-45000,15000,45000;
AREF,CELL2,N,,-12285000,-4070000,5,9,1150000,1060000;
AREF,CELL2,N,,-15735000,-890000,1,6,0,1060000;
AREF,CELL2,N,,-6535000,-3010000,5,8,1150000,1060000;
 . . .
```
↑ STRUCTURE

FIG.4

| ERROR CODE | CONTENTS OF ERROR |
|---|---|
| 0240 | FEATURE DATA HAVING OVER 200 POINTS |
| 0401 | DATA HAVING ABSOLUTE ANGLE |
| 0402 | DATA HAVING ABSOLUTE MAGNIFICATION |
| 0408 | LOGICALLY UNEXISTABLE FEATURE |
| 0410 | FEATURE INSIDE ANOTHER FEATURE |
| 0412 | EXTRA SAME COORDINATES IN ONE FEATURE |
| 0414 | POLYGON WITH START POINT ≠ END POINT |
| 0450 | FEATURE HAVING MAGNIFICATION |
| 001200 | NUMBER OF CHARACTERS BEING OVER LIMIT |
| 110000 | NO FEATURE NAME |
| 120090 | TEXT DATA BEING NOT ON DESIGNATED GRID |
| 120100 | UNPROCESSABLE CHARACTERS FOR REPRESENTING FEATURE |
| 120150 | CROSSING WITH TWIST |
| 120160 | NUMBER OF ZIGZAG STEPS BEING OVER LIMIT WHEN APPROXIMATING |
| 120190 | CROSS POINT OF LINE FEATURES NOT BEING ON GRID |
| 122030 | LINE FEATURE HAVING ZERO OR MINUS WIDTH |
| 122040 | LINE DATA NOT BEING ON GRID |

FIG.11
prior art

```
TREAM,LIBNAME.DB,3,0,98/08/31,09:56:34,98/09/03,16:49:02;
FONTS,CALMA.TF,CALMA.TF,CALMA.TF,CALMA.TF,CALMA.TF;
```
} HEADER

```
STRUCT,CELLNAME1,0.0010,98/07/06,16:18:49,98/09/01,10:56:28;
RECT,50,0,-15001,-45000,15000,45000;
AREF,CELL2,N,,-12285000,-4070000,5,9,1150000,1060000;
AREF,CELL2,N,,-15735000,-890000,1,6,0,1060000;
AREF,CELL2,N,,-6535000,-3010000,5,8,1150000,1060000;
...
```
} STRUCTURE

METHOD AND APPARATUS FOR VERIFYING MASK PATTERN DATA ACCORDING TO GIVEN RULES

BACKGROUND OF THE INVENTION

1. Field of the Invention

The present invention relates to methods and apparatuses for verifying mask pattern data of designed circuits according to given rules, the pattern data including a plurality of feature data.

2. Description of the Related Art

FIG. 9 is a schematic block diagram showing a prior art apparatus for verifying pattern data of a designed semiconductor integrated circuit.

A verification apparatus 10 is a computer on which a verification program is installed, to which an input device 11, a display device 12, and a storage device 13 are connected to constitute a computer system.

FIG. 10 is a flow chart showing processing associated with the apparatus of FIG. 9.

(S1) Pattern data is designed and stored in the storage device 13. FIG. 11 shows hierarchical pattern data for example and the data includes a plurality of feature data.

(S2) The verification apparatus 10 reads the design data from the storage device 13, flatten the data with loosing hierarchical structure, and verifies the design data according to given rules including design rules. If the verification apparatus 10 finds any feature data not meeting the rules, it causes the display device 12 to display the contents of the error. In order not to miss any error, the verification apparatus 10 detects all errors not meeting the rules. However, some of the errors may not problematical (false errors) in view of characteristics of a semiconductor integrated circuit. Accordingly, errors will be detected excessively.

(S3 and S4) If no error is detected, then a designer writes such contents in a request form that a mask should be manufactured according to the design data stored in the storage device 13, or else the process goes to step S5.

(S5) If any error exists but each error is judged by the designer to be false, then the process goes to step S6, or else the process returns to step S1 to perform engineering change so that no true error is detected.

(S6) The same processing as in step S4 is performed.

(S7) The designer additionally writes in the request form to notify that each detected error is false. In a mask manufacturing section, a processing shown in FIG. 12 is performed with using another apparatus not shown.

(S10) Design data is read into the computer of this apparatus.

(S11) In order to manufacture a mask on which a desired pattern is formed, geometric processing associated with a pattern exposure system is performed. The geometric processing includes fracturing features of a pattern into basic features such as rectangles and triangles, reversal, scaling, sizing, rotation, mirror inversion, and geometric logic operation between layers.

Next, processed features are verified according to given rules. For example, it is checked whether or not there is a wrong feature such as a logically unexistable feature (an absurd feature). Although the verification has been basically performed in step S2 of FIG. 10, new errors can arise after the above described geometric processing.

(S12) If the verification is finished without detecting any error, then the process goes to step S14, or else the process goes to step S13.

(S13) An operator checks the contents of the detected error whether or not it is a false one which has been written in the request form in step S7 of FIG. 10, and if it is affirmative, then the process returns to step S11 to continue for the rest features, or else he causes the computer to terminate the process and inquires the designer who wrote in the request form whether or not the error is problematic in view of characteristics of the semiconductor integrated circuit. In the inquiry, if it is found that the error is not problematic, then the process returns to step S11, or else the process returns to step S1 of FIG. 10.

(S14) The verified data are converted into a data format for the exposure system.

However, since human judgment intervenes in step S13, a suspended time becomes longer if the designer in charge is not available, for example, in a late night or on his holiday. Furthermore, the probability of human mistakes increases since the judgments in steps S5 and S13 are performed by different persons.

SUMMARY OF THE INVENTION

Accordingly, it is an object of the present invention to provide a method and an apparatuses for verifying mask pattern data, capable of not only reducing a pattern data preparing time for manufacturing a mask but also decreasing human mistakes arising in the pattern data preparation.

In one aspect of the present invention, there is provided a computer implemented method for verifying pattern data of a designed circuit according to first given rules, the pattern data including a plurality of feature data, the method comprising the steps of:

in a design section,
(a) if there is any feature data not meeting the first given rules, outputting contents of this feature data as an error; and
(b) if first error information indicating that the error is not problematical in view of characteristics of the circuit is inputted, adding the first error information to a file including the pattern data;

in a mask manufacturing section,
(c) reading said file;
(d) processing for obtaining exposure data for manufacturing a mask, on feature data included in said file;
(e) verifying said feature data processed, according to second given rules; (f) if any feature data not meeting said second given rules exists, judging whether or not contents of this feature data is included in said first error information; and
(g) if judged to be included in step (f), then if said first error information indicates not being problematic, judging that said feature data not meeting said second given rules is not problematic.

In step (e), some of the detected errors may not problematical (false errors) in view of characteristics of a semiconductor integrated circuit.

However, with the above configuration, since the false errors which may occur in the mask manufacturing section are in advance included in the first error information added in the design section, almost no necessity of human judgment occurs after preparation of the first error information, which makes it possible to prepare an exposure data for manufacturing a mask in a shorter time than in the prior art.

Further, due to this almost no necessity, a probability of human mistakes is reduced.

Other aspects, objects, and the advantages of the present invention will become apparent from the following detailed description taken in connection with the accompanying drawings.

BRIEF DESCRIPTION OF THE DRAWINGS

FIG. 3 is an illustration showing design data in which error information is added to a header.

FIG. 4 is an illustration showing error codes and contents thereof.

FIG. 11 is an illustration showing pattern data of a designed circuit.

DESCRIPTION OF THE PREFERRED EMBODIMENT

Figure 1:
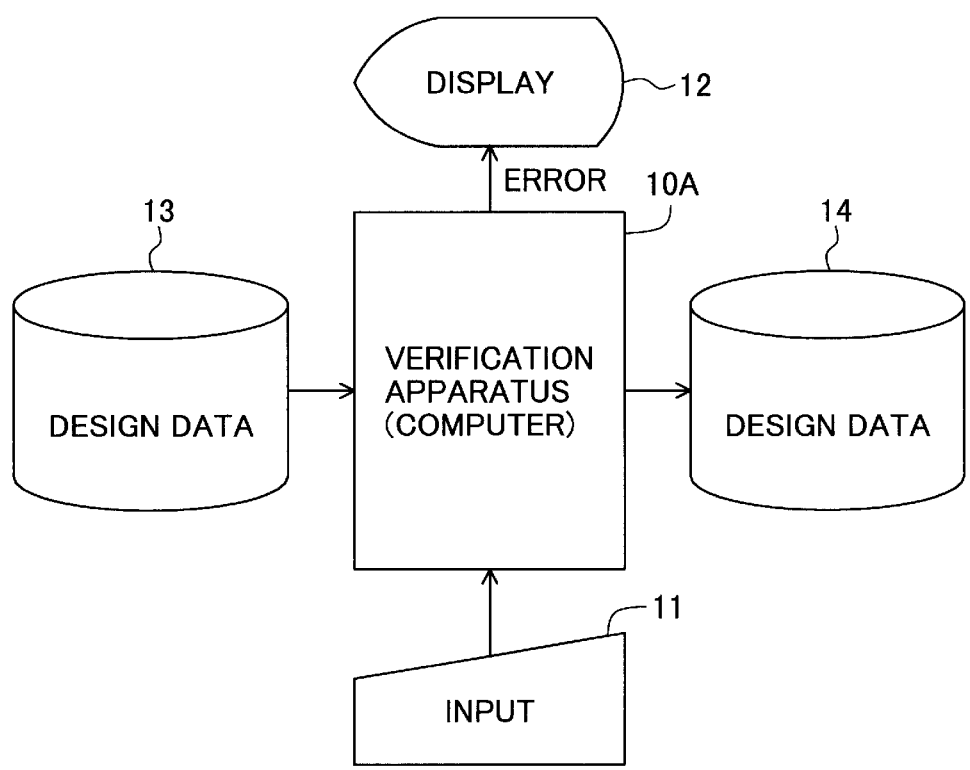
FIG. 1 is a schematic block diagram showing an apparatus for verifying pattern data of a designed semiconductor integrated circuit, of an embodiment according to the present invention.

Referring now to the drawings, wherein like reference characters designate like or corresponding parts throughout several views, preferred embodiments of the present invention are described below.

FIG. 1 is a schematic block diagram showing an apparatus for verifying pattern data of a designed semiconductor integrated circuit, of an embodiment according to the present invention.

The verification apparatus 10A disposed in a design section comprises a computer, on which a verification program is installed, and to which an input device 11, a display device 12, and storage devices 13 and 14 are connected.

Figure 2:
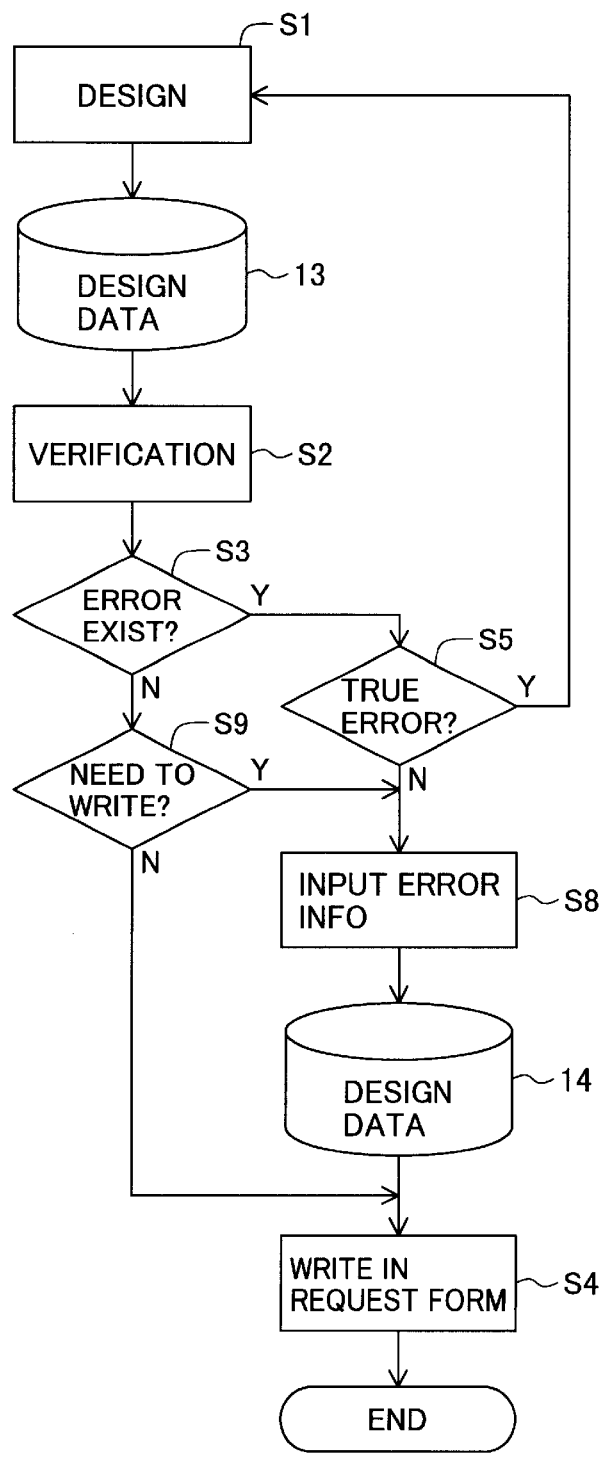
FIG. 2 is a flow chart showing processing associated with the apparatus of FIG. 1.

FIG. 2 is a flow chart showing processing associated with the apparatus of FIG. 1.

(S1) Pattern data is designed and stored in the storage device 13. FIG. 11 shows hierarchical pattern data for example and the data includes a plurality of feature data.

(S2) The verification apparatus 10A reads the design data having hierarchical structure from the storage device 13, flatten the data with loosing hierarchical structure, and verifies the design data according to given rules including design rules. If the verification apparatus 10A finds any feature data not meeting the rules, it causes the display device 12 to display the contents of the error. In order not to miss any error, the verification apparatus 10A detects all errors not meeting the rules. However, some of the errors may false errors, that is, not problematical in view of characteristics of a semiconductor integrated circuit.

(S3) If no error is detected, then the process goes to step S5, or else to step S9.

(S5) If any error exists but each error is judged by the designer to be false, then the process goes to step S8, or else the process returns to step S1 to perform engineering change so that no true error is detected.

(S8) The designer operates the input device while watching the display device 12 to input error information. This error information is described, for example, as

ERR, 120410, −15001, −45000, 15000, 4500, OK wherein 'ERR, 120410' is an error code and, as shown in FIG. 4 for example, contents of all conceivable errors are encoded. The table of FIG. 4 is stored in the verification apparatus 10A and the table can be displayed on the display device 12 to confirm. Next (−15001, −45000) and (15000, 4500) are coordinate pairs of diagonal points of a feature having an error and a rectangle shape. The 'OK' indicates that it is a false error, that is, not problematic in view of characteristics of the semiconductor integrated circuit, therefore when it is found in the apparatus of FIG. 5 described later, the process can continue without stopping.

When any error is detected by the verification apparatus 10A, its content, for example, 'ERR, 120410, 15001, −45000, 15000, 4500' is automatically displayed on the display apparatus 12 and then the designer only operates the input device 11 to input 'OK' or 'NG' to prepare the above described error information.

The verification apparatus 10A stores the designed data stored in the storage device 13 into the storage device 14 with adding the error information. FIG. 3 shows design data made by adding the above error information to that of FIG. 7. In this example, the error information is added to the header of the design data. In FIG. 3, for example, feature data 'RECT, 50.0, −15001, −45000, 15000, 4500;' indicates that the feature is a rectangle (REC) having diagonal coordinate pairs of (−15001, −45000) and (15000, 4500), and belonging to a layer 50_0.

Next, the process goes to step S4.

(S9) If, although no error has been detected, the designer can predict that an error will be detected in the apparatus of FIG. 5 described later, then he selects to go to step S8 in order to input information of this error, or else he selects to go to step S4.

(S4) The designer writes such contents in a request form that a mask should be manufactured according to the design data stored in the storage device 13.

Figure 5:
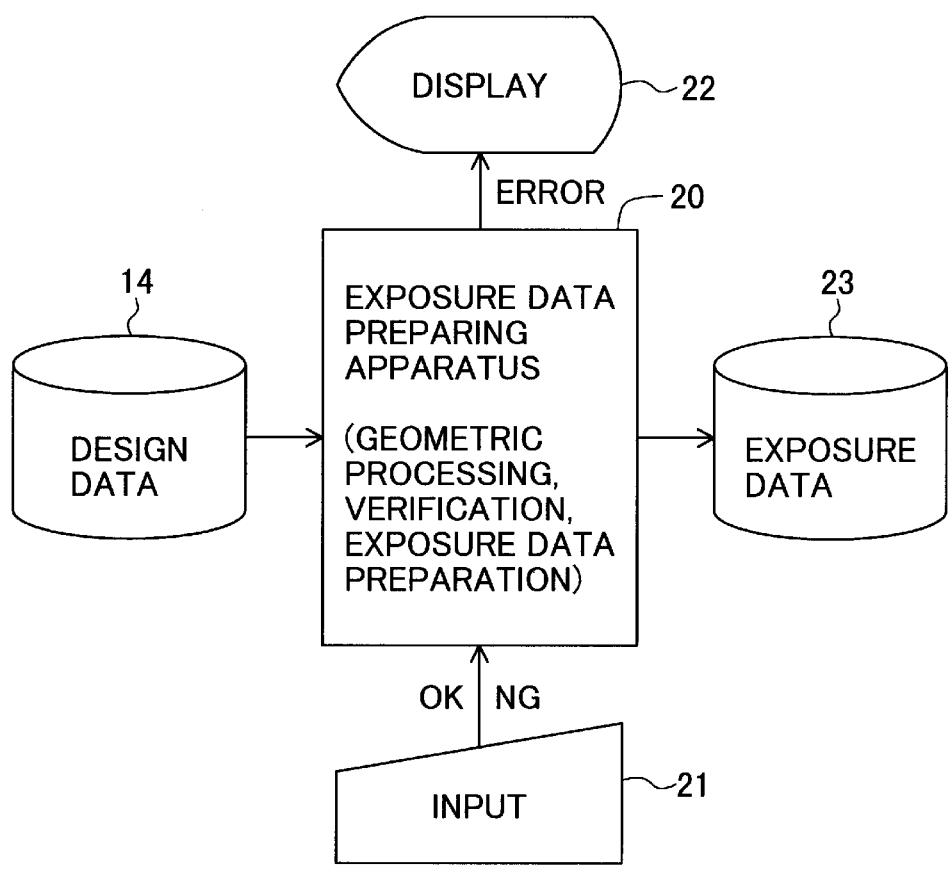
FIG. 5 is a schematic block diagram showing an apparatus for preparing an exposure data for manufacturing a mask.
Figure 6:
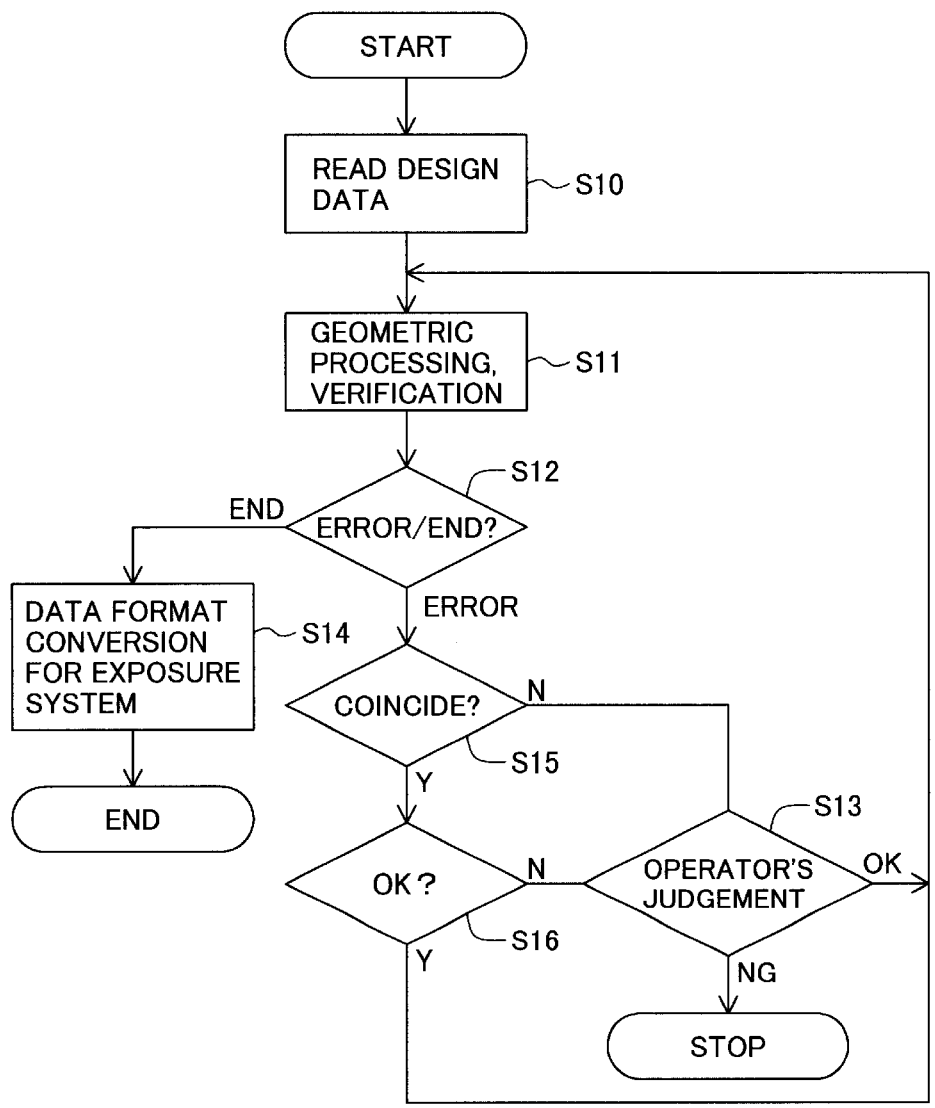
FIG. 6 is a general flow chart showing processing performed by the apparatus of FIG. 5, following the processing of FIG. 2.

FIG. 5 is a schematic block diagram showing an apparatus for preparing an exposure data for manufacturing a mask, disposed in a mask manufacturing section. FIG. 6 is a general flow chart showing processing performed by an exposure data preparing apparatus 20 of FIG. 5, following the processing of FIG. 2.

The apparatus 20 is a computer on which a program for executing geometric processing, verification and exposure data format conversion is installed, to which an input device 21, a display device 22, and storage devices 14 and 23 are connected.

(S10) Design data prepared by the apparatus of FIG. 1 is read from the storage device 14.

Figure 12:
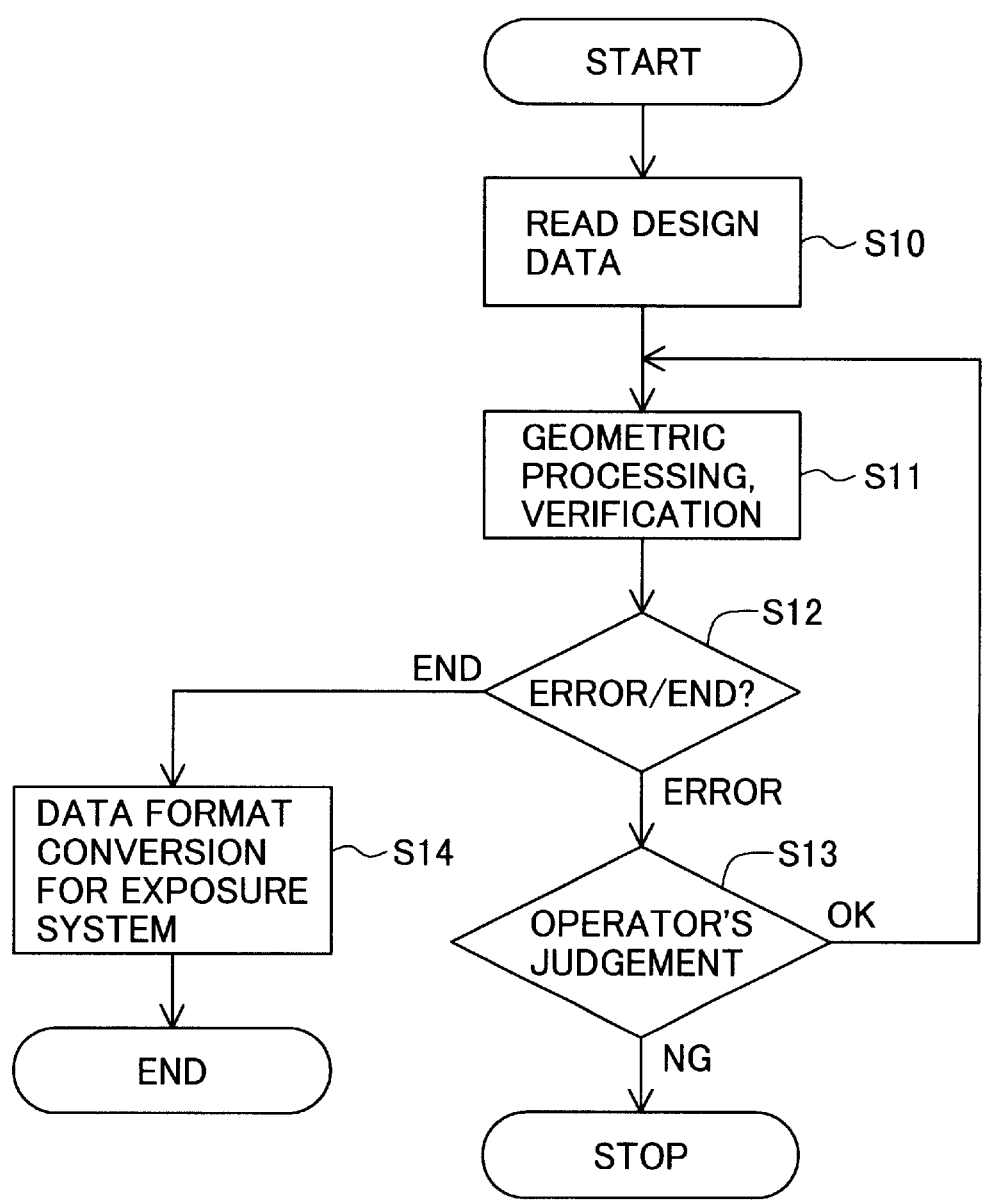
FIG. 12 is a general flow chart showing processing performed by an exposure data preparing apparatus for manufacturing a mask, following the processing of FIG. 10.

(S11) The same figure data processing and verification as in step S11 of FIG. 12 are performed.

(S12) If the verification is finished without detecting any error, then the process goes to step S14, or else the process goes to step S15.

(S14) The verified data is converted into data format for an exposure system.

(S15) The following processing is automatically performed by a verification program installed on the exposure data preparing apparatus 20. That is, if there are an error code and location coordinates of an error feature, which are contents of an error detected in step S11, as the error information in the header of FIG. 7, then it is judged that the detected error is coincident with the stored error information, and the process goes to step S16, or else the process goes to step S13.

(S16) If 'OK' is included in the error information, then the process returns to step S11 to continue for the rest data, or else the process goes to step S13.

(S13) An operator inquires the designer written in the request form whether or not the error is problematic in view of characteristics of the semiconductor integrated circuit, and if the error is not problematic, then the process returns to step S11, or else the process returns to step S1 of FIG. 2.

According to this embodiment, since not only an error which may occur in verification following geometric processing and but also information for dealing with the error are in advance included in design data provided to a mask manufacturing section, it will be rare cases where human judgment occurs in step S13 of FIG. 6, which makes it possible to prepare an exposure data for manufacturing a mask in a shorter time than in the prior art.

Further, due to the rare cases, a probability of human mistakes is reduced as compared with that in the prior art.

Although a preferred embodiment of the present invention has been described, it is to be understood that the invention is not limited thereto and that various changes and modifications may be made without departing from the spirit and scope of the invention.

For example, although FIG. 3 shows a case where the error information is described in the header of the design data file, the error information has only to exist in the file since processing and verification on figure data are performed after a header, a structure (feature data having a hierarchical structure) and a footer in a file are read into a main storage device. That is, the location of the error information may be either in the structure as shown in FIG. 7, or in the footer as shown in FIG. 8.

Figure 7:
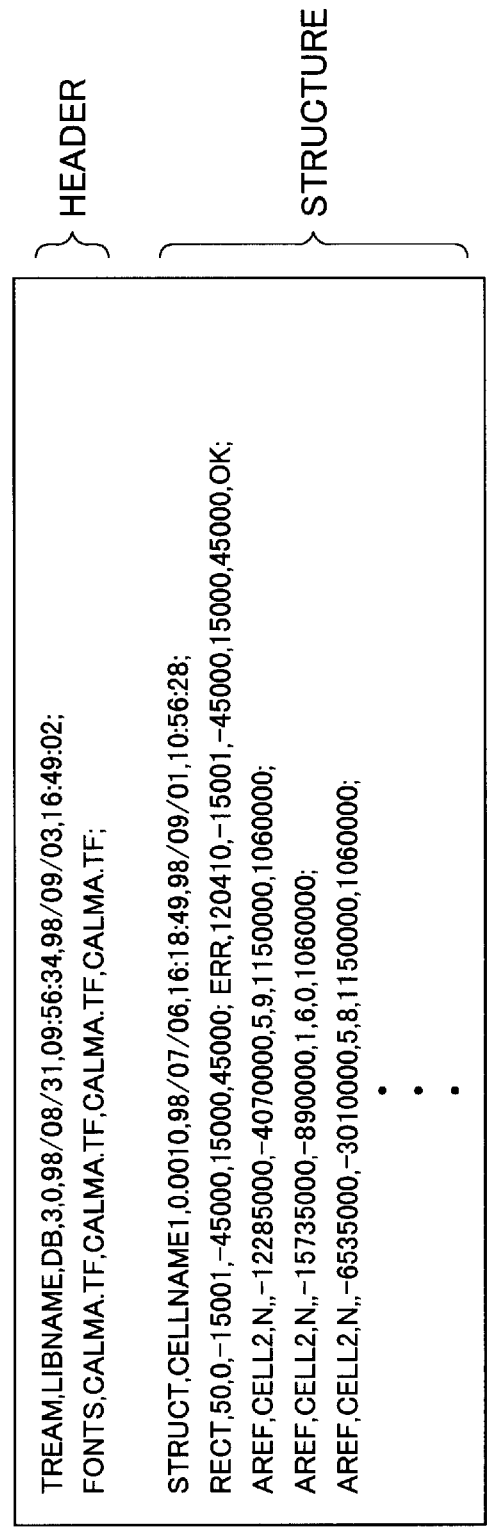
FIG. 7 is an illustration showing design data in which error information is added to pattern data of a hierarchical structure.
Figure 8:
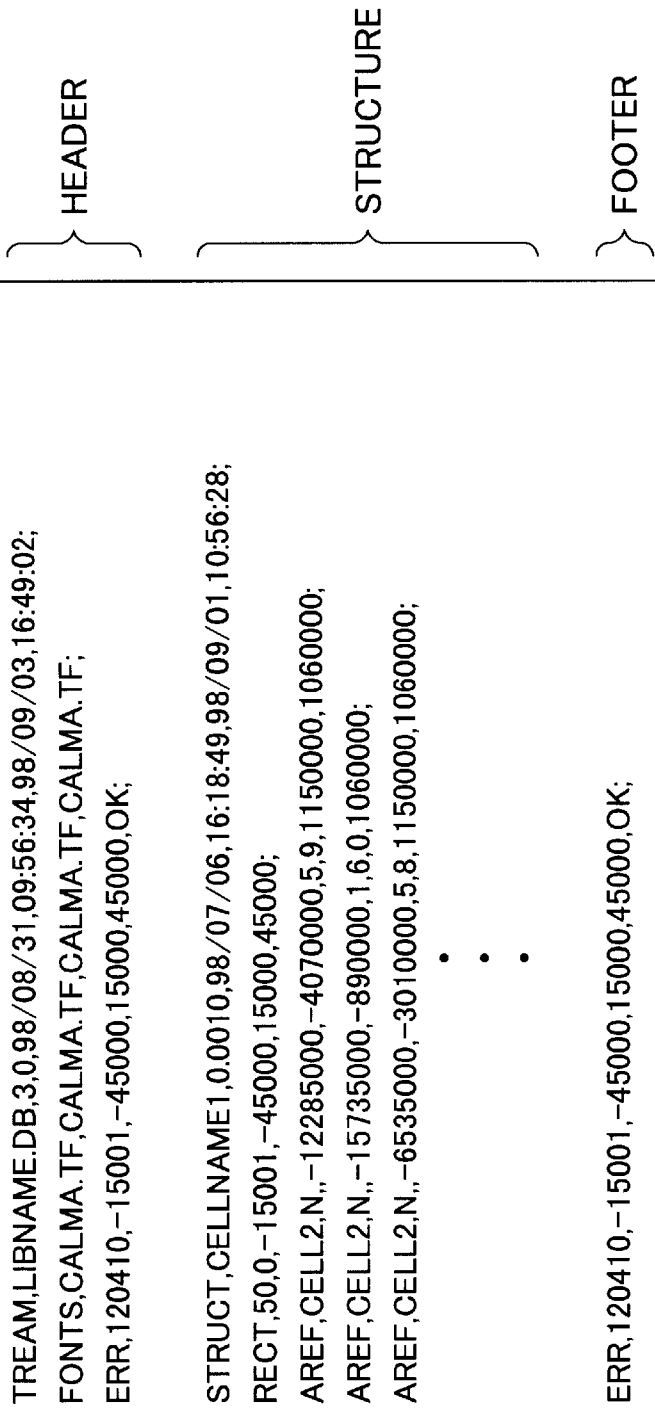
FIG. 8 is an illustration showing design data in which error information is added to a footer.
Figure 9:
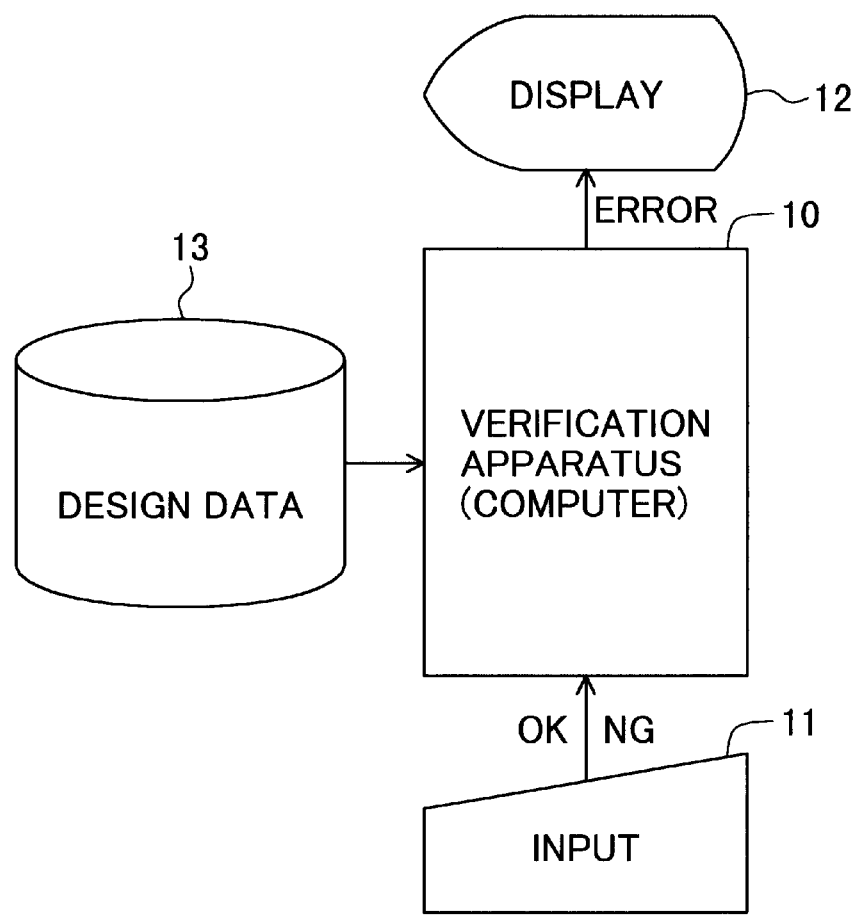
FIG. 9 is a schematic block diagram showing a prior art apparatus for verifying pattern data of a designed semiconductor integrated circuit.
Figure 10:
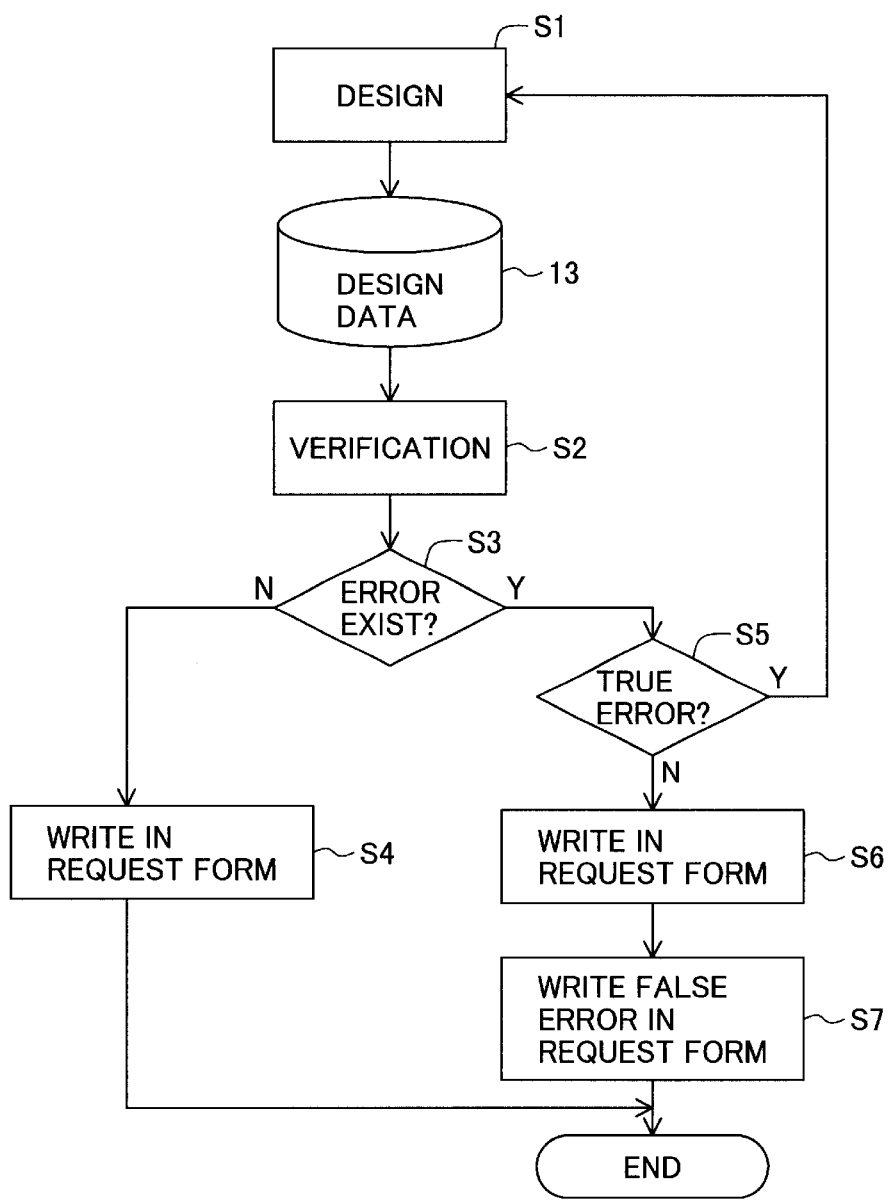
FIG. 10 is a flow chart showing prior art processing associated with the apparatus of FIG. 9.

In the case of FIG. 7, the location coordinates of the error feature can be omitted from the error information if it is defined in advance that the location coordinates of the error feature are equal to those of feature data adjust to the error information. Further, by seeing contents of a file, it is possible to easily find which of features relates to an error.

Furthermore, in step S8 of FIG. 2, a wild card such as * and ? may be used in location coordinates. In this case, in step S15 of FIG. 6, for example, each coordinate compared with * is judged to be in coincidence.

What is claimed is:

1. A computer implemented method for, during a circuit design stage, verifying pattern data of a designed circuit according to given design rules, said pattern data including a plurality of feature data, said method comprising:

if there is any feature data not meeting said given design rules, outputting contents of this feature data as an error;

if there is inputted first error information indicating that said error is not problematical in view of characteristics of said circuit, then outputting said first error information with said pattern data;

during a mask data generating stage, processing for obtaining mask data for manufacturing a mask from the pattern data including the feature data, the processing comprising verifying said feature data processed according to given mask-making rules, where the mask data and mask-making rules are specific to a given exposure system;

if any feature data not meeting said given mask-making rules exists, automatically judging whether or not contents of this feature data corresponds to said first error information; and if the contents of the feature data is judged to correspond to said first error information, then if said first error information indicates not being problematic, automatically judging that said feature data not meeting said given mask-making rules is not problematic.

2. The method of claim 1, further comprising:

if second error information indicating whether or not feature data meeting said given design rules is problematic in view of characteristics of said circuit is inputted, outputting said second error information with said pattern data.

3. The method of claim 1, wherein said first error information includes an error code indicating error contents.

4. The method of claim 2, wherein said second error information includes an error code indicating error contents.

5. The method of claim 3, wherein said first error information further includes coordinates of a feature associated with said error.

6. The method of claim 4, wherein said second error information further includes coordinates of a feature associated with said error.

7. A pattern data verifying apparatus equipped with a computer on which a computer program is installed, said computer program causing said computer to, during a design stage, verify pattern data of a designed circuit according to given design rules, said pattern data including a plurality of feature data, wherein said computer program causes said computer to perform a process, the process comprising:

if there is any feature data not meeting said given design rules, outputting contents of this feature data as an error; and if there is inputted first error information indicating that said error is not problematical in view of characteristics of said circuit, then outputting said first error information with said pattern data;

during a mask data generating stage, processing for obtaining mask data for manufacturing a mask from the pattern data including the feature data, the processing comprising verifying said feature data processed, according to given mask-making rules, where the mask data and mask-making rules are specific to a given exposure system;

if any feature data not meeting said given mask-making rules exists, judging whether or not contents of this feature data corresponds to said first error information; and if the contents of the feature data is judged to correspond to said first error information, then if said first error information indicates not being problematic, automatically judging that said feature data not meeting said given mask-making rules is not problematic.

8. A computer readable storage medium having a computer program stored thereon for causing a computer to, during a design stage, verify pattern data of a designed circuit according to first given rules, said pattern data including a plurality of feature data, wherein said computer program causes said computer to perform a process, the process comprising:

if there is any feature data not meeting said given design rules, outputting contents of this feature data as an error; and if there is inputted first error information indicating that said error is not problematical in view of characteristics of said circuit, then outputting said first error information with said pattern data;

during a mask data generating stage, processing for obtaining mask data for manufacturing a mask from the pattern data including the feature data, the processing comprising verifying said feature data processed, according to given mask-making rules, where the mask data and mask-making rules are specific to a given exposure system;

if any feature data not meeting said given mask-making rules exists, judging whether or not contents of this feature data corresponds to said first error information; and if the contents of the feature data is judged to correspond to said first error information, then if said first error information indicates not being problematic, automatically judging that said feature data not meeting said given mask-making rules is not problematic.

9. A computer implemented method for verifying pattern data of a designed circuit according to given design rules, the pattern data including a plurality of features, the method comprising:

during a design stage:
determining that a feature of the pattern data has a design error that violates the given design rules,
manually determining that the design error is not problematic,
generating information associating the determined design error with the corresponding feature; and during a mask data generating stage:
generating mask data based on the pattern data, where the mask data is for manufacturing an exposure mask for a particular exposure system,
determining that a feature in the mask data that is analogous to the determined feature as found in the mask data has an error that violates given mask-making rules, where the mask-making rules are specific to a particular exposure system, and
based on the information associating the design error with the feature, automatically determining that the error violating the mask-making rules corresponds to the design error of the feature.

10. A method of photomask design, comprising:

during a design stage, automatically locating a pseudo design error by applying design rules to a hierarchical circuit design data;

interactively indicating that the located pseudo design error is acceptable and generating information identifying the pseudo design error;

storing an association between the hierarchical circuit design data and the information identifying the pseudo design error that has been indicated to be acceptable; and during a mask data generating stage, based on the design data, generating mask data for manufacturing a mask for a particular exposure system by: performing geometric processing on the hierarchical circuit design data, applying mask-making rules specific to the exposure system to detect pseudo errors resulting from the geometric processing, and automatically accepting a detected pseudo error by using the stored association to automatically determine that the detected pseudo error corresponds to the pseudo design error previously located by applying the design rules.

* * * * *